United States Patent [19]

Aldridge et al.

[11] Patent Number: 4,909,185

[45] Date of Patent: Mar. 20, 1990

[54] CANTILEVER AND COLD ZONE ASSEMBLY FOR LOADING AND UNLOADING AN OVEN

[75] Inventors: Robert E. Aldridge, Beaverton; Bruce E. Beattie, Portland, both of Oreg.

[73] Assignee: Weiss Scientific Glass Blowing Co.

[21] Appl. No.: 151,954

[22] Filed: Feb. 3, 1988

[51] Int. Cl.4 .............................................. C23C 8/00
[52] U.S. Cl. ..................................... 118/729; 414/217
[58] Field of Search ................ 118/725, 729; 414/217

[56] References Cited

U.S. PATENT DOCUMENTS

| | | | |
|---|---|---|---|
| 3,615,944 | 10/1971 | Sheng et al. | 148/189 |
| 3,828,722 | 8/1974 | Reuter et al. | 118/69 X |
| 4,267,205 | 5/1981 | Pastor et al. | 427/93 |
| 4,293,590 | 10/1981 | Takagi et al. | 427/93 |
| 4,436,509 | 3/1984 | Kocmanek et al. | 118/729 X |
| 4,459,104 | 7/1984 | Wollmann | 432/123 |
| 4,523,985 | 6/1985 | Dimock | 204/298 |
| 4,558,388 | 12/1985 | Graves, Jr. | 360/135 |
| 4,573,431 | 3/1986 | Sarkozy | 118/725 |
| 4,711,197 | 12/1987 | Taylor, Sr. | 118/715 |
| 4,751,895 | 6/1988 | Yates | 118/500 X |
| 4,753,192 | 6/1988 | Goldsmith et al. | 118/725 |
| 4,760,244 | 7/1988 | Hokynar | 118/729 X |

OTHER PUBLICATIONS

Brochure page entitled "Weiss Cantilever Loading Systems".

Primary Examiner—Shrive Beck
Assistant Examiner—Alain Bashore
Attorney, Agent, or Firm—Kolisch, Hartwell & Dickinson

[57] ABSTRACT

Apparatus for heating product with the product during heating subjected to a controlled, nonatmospheric gas environment. The apparatus includes a double-walled cold zone assembly adapted to be placed against an oven opening, the assembly having a depository chamber within it for securing product during cooling of the product. A cantilever projecting through the assembly is operated to move product between the depository chamber of the assembly and the oven where heat treatment occurs.

10 Claims, 2 Drawing Sheets

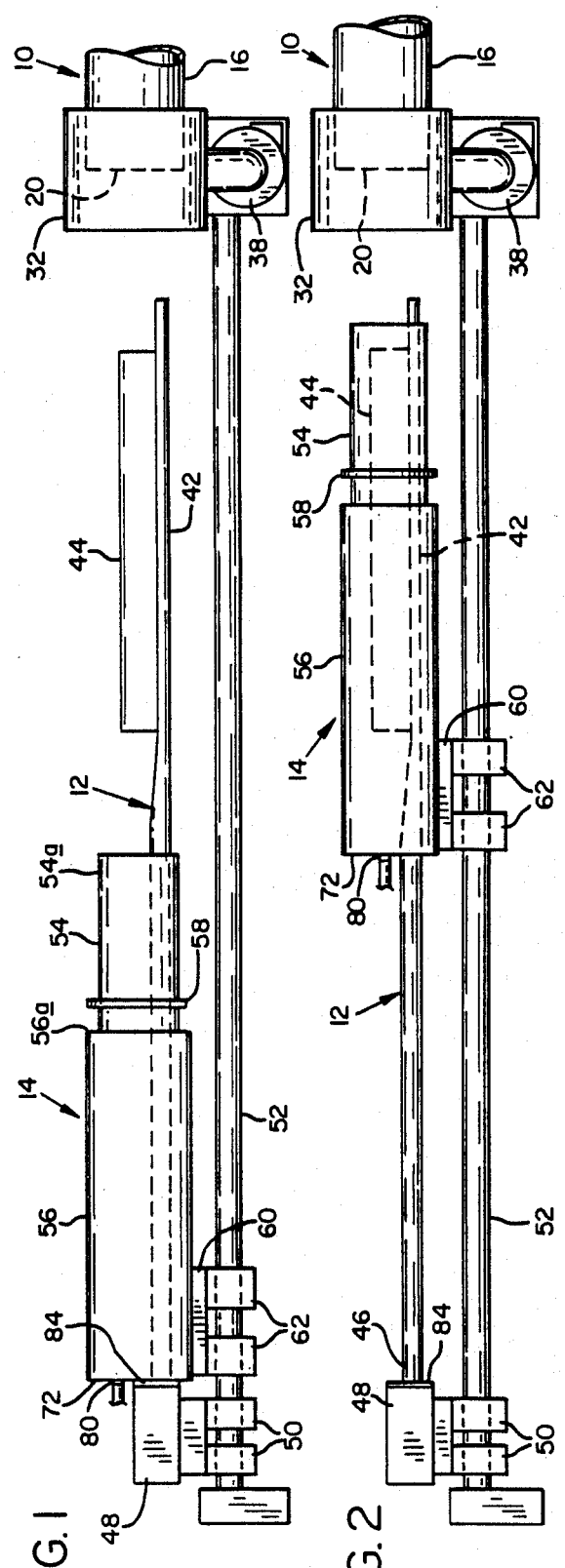
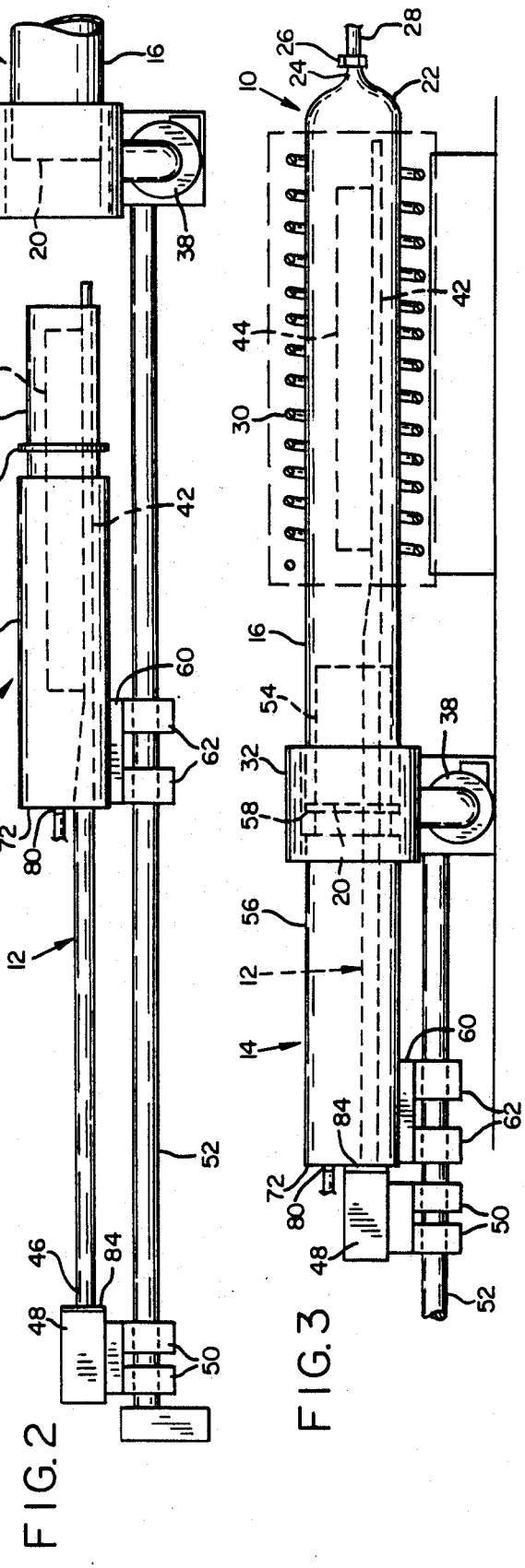
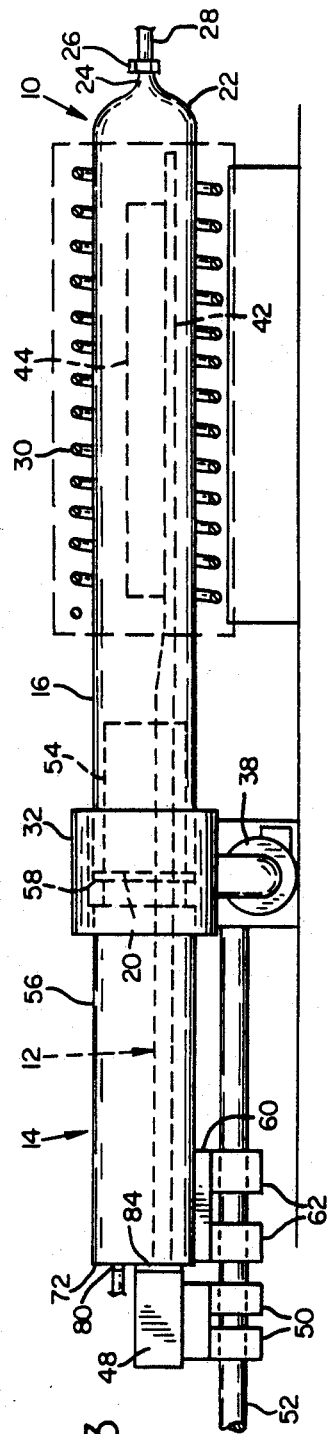
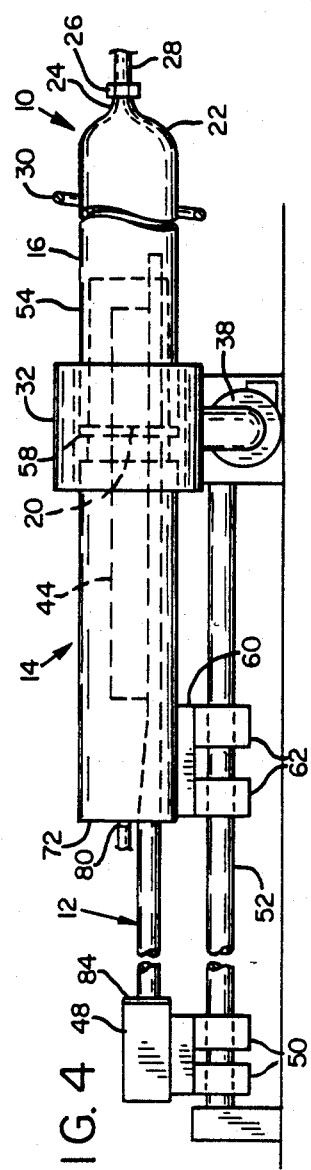

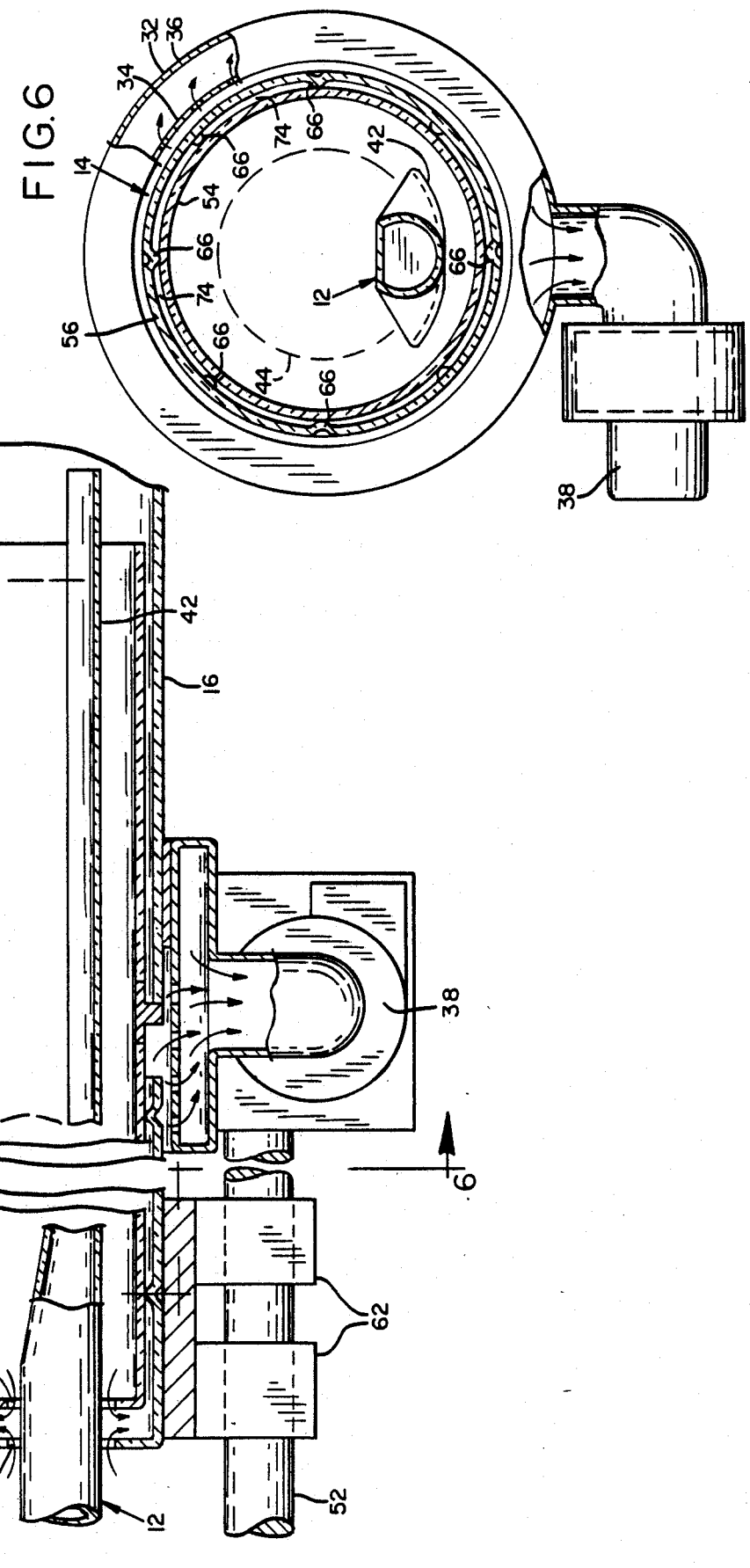

CANTILEVER AND COLD ZONE ASSEMBLY FOR LOADING AND UNLOADING AN OVEN

BACKGROUND AND SUMMARY OF THE INVENTION

This invention concerns apparatus for processing product, wherein the product is heated to an elevated temperature, and while heated subjected to a nonatmospheric gas environment, whereby the physical characteristics of the product are changed by the process. The apparatus may be employed, for instance, in producing an oxide coating as a surface layer on silicon wafers, although in describing this particular use, it is not intended thereby to limit the invention, as obviously the apparatus may be employed in other processes where heating with a controlled gaseous environment is required.

In the semiconductor manufacturing industry, it is a common practice to produce an oxide coating on wafers, normally of silicon, with these wafers then being employed in the production of integrated circuits. To produce an oxide coating on such wafers, it is conventional to mount a plurality of the wafers on a support, sometimes referred to as a boat, and then to move the boat together with the wafers supported thereby into an oven. The oven is purged of atmospheric gas and a processing gas introduced, with the processing gas selected being dictated by the type of oxide coating which is desired in the final product. With heating of the oven containing the wafers and the processing gas, the oxide coating is produced. After coating, the oven is purged of processing gas and the load of coated wafers permitted to cool.

To prevent contamination, it is conventional to employ, as the means defining the oven for the treatment of the wafers, an elongate quartz glass tube. A tube of this description is capable of being thoroughly cleaned and the quartz glass forming the tube is substantially completely inert under the operating conditions employed. To produce coated wafers of consistent quality, it is important that techniques be utilized which effectively prevent any dust or other foreign matter from being introduced into the oven during the oxidation process.

One form of apparatus that has been employed in the past in the preparation of oxide coatings includes what is commonly referred to as an elongate cantilever which has a distal or unsupported end and an opposite mounted end. The mounted end referred to is mounted for movement in an elongate path, with movement in one direction being operable to thrust the distal end of the cantilever into the quartz tube forming the oven and movement in the opposite direction serving to retract the distal end of the cantilever. With a boat or other means supporting wafers mounted on the cantilever's distal end, and with a door mounted on the cantilever effective to close off the oven tube with the distal end fully inserted, means is provided for inserting the wafers into the oven and for closing the oven, with the elimination of any rollers or other slide support for the boat within the oven which would tend to produce dust and result in contamination. The cantilever system is fairly widely used, but has a serious disadvantage when employed in the production of coated wafers since it is difficult, rapidly and efficiently, to cool the wafers after the coating process without contamination. If the cantilever described is retracted from the tubular oven and with the wafers still hot, the wafers while in this hot state are exposed to the atmosphere, and contamination results.

In another form of equipment, a so-called elephant is employed which is an elongate, hollow, normally quartz tube that is mounted in a position with an end of the tube in registry with the open end of the oven tube, thus to close off the open end of the oven tube. A boat or other means movable within the elephant tube is shifted to transfer a load of wafers into the oven tube. The elephant tube provides a chamber where cooling can take place together with purging, which is outside the furnace. However, the use of the boat introduces a problem of dust and resultant contamination. Furthermore, if the elephant tube is to be purged of processing gas, such is done through an opening at the end of the tube remote from the oven. With many processing gases being highly noxious, proper ventilation and the safety of personnel operating the equipment become a problem.

A general object of this invention is to provide novel apparatus for processing product at an elevated temperature and in a nonatmospheric gas environment, which features a walled assembly having a depository chamber defined within the assembly, product being movable into the chamber during cooling.

Another object is to provide such apparatus with improved means for channeling gas therethrough, as when purging the apparatus of atmospheric gas and introducing into the apparatus a processing gas.

A further general object is to provide apparatus for processing product at an elevated temperature and for then cooling the product, constructed in such a manner as to minimize contamination problems characterizing prior art equipment.

In a preferred embodiment of the invention, a walled assembly is provided having within it a depository chamber for receiving product during cooling of the product. A cantilever having a distal end for supporting product extends into the depository chamber. The assembly is movable to be placed against an oven opening when the product is heated, and the cantilever is movable in a path paralleling that of the walled assembly to move the product into the oven.

A more specific object of the invention is to provide such a walled assembly which includes a pair of concentric tubes, and there being a space between the tubes providing for the channeling of gas. The inner wall of the inner tube defines a depository chamber, and the space between the concentric tubes is utilized to channel gas traveling through the depository chamber back to a zone where a means for scavenging gas is provided. With the concentric tube assembly mounted for movement toward and away from the open end of an oven tube, the gas scavenger means may conveniently be located adjacent this open end of the oven tube, and the space between the tubes utilized to return gas traveling down the concentric tube assembly to the region where the scavenger means is located.

These and various other objects and advantages of the invention will become more fully apparent as the following description is read in conjunction with the accompanying drawings, wherein:

FIG. 1 is a simplified drawing, showing a double-walled cold zone assembly and cantilever in apparatus as contemplated, with the cantilever and assembly in their loading position, and also showing, at the right of the figure, a scavenger box and portions of an oven tube;

FIG. 2 is similar to FIG. 1, but showing the cantilever and assembly in an initial purging position;

FIG. 3 is similar to FIG. 2, but illustrating the cantilever and assembly in their processing position, and also showing the oven tube in its entirety and means for heating the oven tube;

FIG. 4 is similar to FIGS. 2 and 3, but showing the cantilever and assembly in another purging position, which is also their cooling and purging position;

FIG. 5 is a view, on a larger scale, illustrating details of the cold zone assembly, scavenger box, and oven tube; and FIG. 6 is a cross-sectional view, taken generally along the line 6—6 in FIG. 5.

Referring now to the drawings, and initially more particularly to FIGS. 1 through 4, illustrated generally at 10 is what is referred to herein as an oven, utilized in the heating at an elevated temperature and for a period of time the product being processed, for example, a load of silicon wafers to produce an oxide coating on the wafers. A cantilever, indicated generally at 12, supports on its distal end the wafer load. A walled assembly, more specifically, a double-walled cold zone assembly, indicated generally at 14, is employed along with the cantilever in the loading and unloading of product from the oven and provides a means for producing a controlled nonatmospheric gas environment within the oven and about the load of product when it is cooled.

Describing in more detail oven 10, such includes an elongate oven tube 16 which typically may be an elongate tube of quartz glass. The inner surface of the wall forming the tube, shown at 18 in FIG. 5, defines an elongate internal oven chamber extending the length of the tube. The left end of the oven tube, indicated at 20 in FIG. 1, is open, and this open end constitutes an oven opening communicating with the oven chamber. The opposite end of the oven tube as seen in FIGS. 3 and 4 is essentially closed as by curved wall 22. Extending from the center of curved wall 22 is a hollow extension 24 which has mounted thereabout a fitting 26 equipped with a conduit 28. The interior of conduit 28 communicates, through fitting 26 and the hollow extension, with the interior of the oven tube. When purging the oven tube of atmospheric gas with a purge gas, such as nitrogen, the purge gas is supplied the oven through conduit 28. The conduit is also employed to feed processing gas to the interior of the oven tube to produce the environment necessary for the production of an oxide coating on the product being processed.

The oven tube is heated through energizing of an electric coil 30 extending about the oven tube.

Adjacent oven opening 20 a scavenger zone is provided, where gases are removed and exhausted at a remote location. Specifically, this scavenger zone is produced by a scavenger box 32 which surrounds the oven tube at the location of the oven opening. The scavenger box, and referring to FIGS. 5 and 6, includes an inner, substantially cylindrical perforate wall 34 sealed to the exterior of tube 16 by seal 35, and an outer wall 36. These are joined and define therebetween an annular chamber. A blower is shown at 38 having its intake end connected to this annular chamber. The exhaust end of the blower may be connected to a suitable conduit, which serves to channel gas scavenged by the box to a remote location. With operation of the blower, a suction is created in the annular space between walls 34, 36, drawing gas through the perforations in wall 34, such gas then being exhausted to a remote location.

Considering now the construction of cantilever 12, and referring to FIGS. 1-4, the cantilever comprises an elongate member, prepared usually from silicon carbide, which for much of its length is cylindrical in shape and which terminates at a distal end which is flattened and designated at 42. The flattened end is used to support the load of product being processed, illustrated schematically in the drawings at 44. The cantilever opposite its distal end 42 has a mounted end 46 supported on a carriage mounting 48. At the bottom of the carriage mounting and forming part of the mounting are linear motion bearings 50 which ride on elongate cylindrical rails, such as rail 52. These rails define a path of movement for the carriage mounting and the cantilever supported thereon which is lineal and generally parallels the axis of oven tube 16. The cantilever is movable in its path between a fully retracted position, shown in FIG. 1, and a fully extended position, shown in FIG. 3, where the flattened distal end of the cantilever is well within the confines of oven tube 16.

The cold zone assembly in general terms comprises a pair of concentric tubes, normally of quartz glass, including inner tube 54 and outer tube 56. The outer tube is suitably mounted on the inner tube by structure to be described. Tube 54 has a protruding end 54a projecting somewhat beyond end 56a of the outer tube. Encircling this protruding end, slightly outwardly of end 56a of the outer tube, and an integral part of the inner tube, is a flange 58.

The double-walled cold zone assembly is supported on a carriage mounting 60. At the base of the carriage mounting and forming a part of the carriage mounting are linear motion bearings 62 which ride on rails 52 earlier described. With the organization described, the cold zone assembly is movable in a path which parallels the movement of the cantilever. More broadly stated, the cantilever and cold zone assembly are mounted for movement in lineal nondivergent-nonconvergent paths.

As will be described in greater detail, the cantilever is mounted with such extending through the double-walled cold zone assembly. Assembly 14 is movable between the retracted position shown in FIG. 1 and an extended position shown in FIG. 3 wherein protruding end 54a extends into the oven chamber defined within oven tube 16 and with flange 58 abutting the end of oven tube 16 to form a seal between oven tube 16 and the exterior of inner tube 54 in cold zone assembly 14.

Referring now more particularly to FIGS. 5 and 6 for a more detailed description of the cold zone assembly, the extremity of protruding end 54a is open. The inner surface of tube 54 defines a depository chamber within the assembly and the opening at the extremity of end 54a functions as a depository opening leading to this chamber.

Outer tube 56 is supported on inner tube 54 as by providing dimples 66 in the outer tube indented inwardly to rest on and space the outer tube about the inner tube. Securing the two tubes together is means such as glass braces 68.

Tubes 54, 56 have an adjacent set of ends, at the left end of the assembly as shown in FIG. 1 and FIG. 5, and these are essentially closed off, as with end walls 70, 72. These end walls are spaced slightly from each other, and the space between these end walls communicates with the annular space 74 defined between the exterior surface of tube 54 and the internal surface of tube 56. The space between the end walls and annular space 74 provide a channel for the flow of gas with this channel terminating at end 56a of the outer tube.

End walls 70, 72 are provided with ports or apertures 76, 78. These ports provide a passage for the extension therethrough and into and beyond the cold wall assembly of the cantilever earlier described. A slight clearance is provided between the inner circumferences of these ports and the outer surface of the cantilever.

Shown at 80 is a nipple which extends through wall 72 and joins with wall 70. A passage 82 which extends through the nipple communicates with the depository chamber defined within tube 54. A flexible hose mounted on the protruding end of the nipple provides a means for introducing a purge gas, such as nitrogen, to the depository chamber defined within tube 54.

Referring to FIG. 2, it will be noted that the mounting for the proximal end of the cantilever is provided with a sealing member such as the O-ring shown at 84. With this mounting brought up against the outer side of end wall 72, the sealing member engages the outer side of the end wall to produce a seal.

Describing how the apparatus may be employed in the production of oxide coatings on silicon wafers, with the apparatus positioned as shown in FIG. 1, the distal end of the cantilever protrudes beyond the cold zone assembly and a load of wafers may be placed on this distal end.

With the wafer load deposit on the cantilever, cold zone assembly 14 is shifted on rails 52 to place tube 54 in encompassing relation to the load, as shown in FIG. 2. Initial purging of the depository chamber within tube 54, and the oven chamber within tube 16, may then be performed by introducing purge gas, such as nitrogen, through fitting 26 and nipple 80.

After this initial purging, the cold zone assembly and cantilever are shifted to the position shown in FIG. 4, where additional purging takes place. In the position of FIG. 4, flange 58 of the cold zone assembly is flush against the opening of the oven tube, and the cantilever supports the load for the most part within inner tube 54 of the cold zone assembly. Gas purged from the assembly and oven tube flows into the space between end walls 70, 72 and is channeled by space 74 to end 56a of tube 56, to be expelled into the region encompassed by the scavenger box. Purging is continued until the depository chamber and oven chamber are essentially completely free of contaminating gas.

The cantilever is then shifted to place it in the position shown in FIG. 3, where the flattened end of the cantilever carrying the load to be processed fully extends into the oven tube. With energizing of conductor coil 30, a temperature of, for instance, 850° C. is produced within the oven chamber defined by the oven tube. During heating, process gas introduced through fitting 26 replaces purge gas. This process gas, which may be noxious, travels down the oven chamber within the oven tube and the interior of tube 54 to be channeled by space 74 to end 56a of tube 56, where the gas is expelled into the region encompassed by scavenger box 32. Operation of blower 38 expels gas exiting from the cold zone assembly into the region encompassed by the scavenger box.

At the conclusion of the heating cycle, the supply of process gas is stopped and the interior of the oven tube and the depository chamber purged with nitrogen Heating with coil 30 is terminated, and the cantilever retracted to place it in the position shown in FIG. 4, where its distal end together with its load is, for the most part, residing within the depository chamber of assembly 14 and an end of the oven tube which is not heated. The load is maintained in this position, and with the introduction of purge gas, until a temperature, for instance, of about 650° C. is reached. At this temperature, the load may be exposed to the atmosphere without contamination occurring.

It will be noted that the apparatus described provides a controlled environment prior to processing, and also during cooling of the load of product processed. A cantilever is employed in the movement of product into and out of the oven tube, resulting in no contamination being produced within the oven tube through the loading process. Cold zone assembly 14 provides a depository chamber for holding the product during purging and cooling. During this purging and cooling, contamination of the product is prevented because of the controlled conditions existing about the product. Noxious process gas is channeled by the cold zone assembly to be exhausted into the region encompassed by the scavenger box. The apparatus is convenient to use and provides consistent quality in the product being processed.

While a particular embodiment of the invention has been described, it is obvious that variations and modifications are possible, the detailed description set forth herein being for the purpose of illustration and not by way of limitation.

It is claimed and desired to secure by Letters Patent:

1. In combination with an oven having an internal oven chamber and an oven opening in an extremity of the oven communicating with said oven chamber accommodating the insertion of product into the oven,
   an elongate walled assembly disposed externally of said oven having a depository chamber defined therewithin and a depository opening at one end of the assembly communicating with the depository chamber, said walled assembly at its opposite end having end wall structure closing off, the depository chamber,
   means mounting said walled assembly for movement in a path between a position where said depository opening is separated by a space from said oven opening and a position where said depository opening registers with said oven opening of said oven,
   a cantilever having a mounted and supported end and a distal unsupported end and said distal end having means for supporting product, said cantilever having its mounted end located beyond said opposite end of the walled assembly in all positions of the walled assembly from the one end of the walled assembly and extending from said mounted end through said end wall structure into said depository chamber to its distal end located adjacent said oven opening and in said space, and
   means disposed externally of the walled assembly mounting and providing support for the mounted end of said cantilever whereby said cantilever is movable in a path through said openings to place said distal end in said oven chamber.

2. The combination of claim 1, which further includes means for introducing processing gas into said oven chamber, said walled assembly including a port spaced from said depository opening through which processing gas exits from said depository chamber.

3. The combination of claim 1, which further includes scavenger means for scavenging gas disposed adjacent said oven opening, sealing means mounted on the cantilever adjacent its mounted end, and means for introducing processing gas into said oven chamber, said walled assembly including a port spaced from said depository opening through which processing gas exits from the depository chamber, said walled assembly further including channel means for channeling gas flow from said port to adjacent said scavenger means with said oven opening registering with said depository opening, said sealing means moving with said cantilever to be against said end wall structure to provide a seal sealing the cantilever with the end wall structure with the walled assembly positioned where said depository opening registers with said oven opening and with said cantilever positioned to place said distal end in said oven chamber.

4. The combination of claim 1, wherein the means mounting said walled assembly and cantilever define lineal nondivergent-nonconvergent paths for the assembly and cantilever.

5. The combination of:
a double-walled cold zone assembly adapted to be placed against an oven opening comprising an inner elongate tube having a hollow interior and bounded by an outer bounding surface, an outer elongate tube bounded by an inner bounding surface mounted about the inner tube and with said inner bounding surface spaced outward from said outer bounding surface,
an elongate cantilever having a mounted and supported end and a distal unsupported end disposed with the cantilever extending into the interior of said inner tube and from one end of said inner tube, the opposite end of the inner tube being open,
an end wall substantially closing said one end of the inner tube and an end wall substantially closing off said outer tube disposed outwardly of said end wall of the inner tube,
said end walls and the outer bounding surface of said inner tube and the inner bounding surface of the outer tube collectively defining a channel for the flow of processing gas,
and means mounting the mounted end of the cantilever and means mounting said cold zone assembly whereby the cantilever and cold zone assembly are movable in lineal nondivergent-nonconvergent paths and with the distal end of the cantilever being movable beyond the opposite end of said inner tube, the means mounting the mounted end of the cantilever being disposed externally of the double-walled cold zone assembly and the cantilever passing through the end walls closing off the inner and outer tubes to extend into the interior of the inner tube, the distal unsupported end of the cantilever having means for supporting product.

6. The combination of claim 5, which further comprises an oven having an internal oven chamber and an oven opening in an extremity of the oven communicating with said oven chamber, and wherein the means mounting said cold zone assembly mounts said cold zone assembly for movement between a position wherein its said opposite end registers with said oven opening and a position wherein said opposite end is spaced from said oven opening.

7. The combination of claim 6, which further includes scavenger means for scavenging gas disposed about said oven opening.

8. The combination of:

an elongate oven tube having an elongate internal oven chamber defined within the tube and an oven opening at one end of the oven tube providing for the insertion of product within the oven chamber, means for heating the oven tube and means for introducing processing gas into said oven chamber,
a double-walled cold zone assembly comprising an inner elongate tube having a hollow interior bounded by an outer bounding surface and an elongate outer tube having an inner bounding surface, the outer tube being mounted about the inner tube with the inner bounding surface spaced from the outer bounding surface, one end of the inner tube being adjacent one end of the outer tube and the opposite end of the inner tube being adjacent the opposite end of the outer tube,
an elongate cantilever having a mounted and supported end and a distal unsupported end, the mounted end of the cantilever being located beyond said one end of the inner tube and beyond said one end of the outer tube and the cantilever extending from its mounted end through said one end of the inner tube into the interior of said inner tube, said opposite end of the inner tube being open,
means mounting the mounted end of the cantilever and means mounting said cold zone assembly for movement of the cantilever and cold zone assembly in lineal nondivergent-nonconvergent paths and with the distal end of the cantilever being movable beyond said opposite open end of said inner tube of the cold zone assembly, said cold zone assembly being movable between a position wherein said opposite open end of the inner tube is in registry with and against said oven opening and a position wherein said opposite open end is spaced from said oven opening,
the means mounting the mounted end of the cantilever an end wall being located externally of the double-walled cold zone assembly,
an end wall substantially closing off said one end of the inner tube and an end wall substantially closing off said one end of said outer tube with said end wall of said outer tube being disposed outwardly of said end wall closing off the inner tube, said cantilever in extending from its said mounted end passing through said end walls, a gas inlet port connecting with the interior of the inner tube at a region adjacent the end wall closing of the inner tube,
said spaced end walls and the space between said bounding surfaces defining a path for the flow of processing gas.

9. The apparatus of claim 8, which further includes scavenger means disposed about said oven opening, said path channeling processing gas to adjacent said scavenger means.

10. Apparatus comprising:
an elongate oven tube having an elongate oven chamber defined therewithin and an opening at one end of the oven tube communicating with said oven chamber, means for introducing processing gas into said oven tube and means for heating said oven tube,
a cold zone assembly disposed opposite the oven opening comprising a pair of concentric inner and outer tubes, the inner tube of said pair of concentric tubes having an opening at one end and said cold zone assembly being mounted for movement in a path between a position wherein said open end of said inner tube is against and registering with the open end of the furnace tube and a position wherein said open end of the inner tube is spaced from said open end of the furnace tube, an elongate load-carrying cantilever having at one end thereof a mounted end and the cantilever extending freely from the mounted end to a distal end, said mounted end being located beyond the cold zone assembly in a direction extending away from the oven opening, mounted means mounting the mounted end of the cantilever disposed externally of the cold zone assembly with the cantilever extending from the mounting means into said inner tube of said concentric tube assembly, the means mounting the cantilever providing for movement of the cantilever in a path which parallels the movement of the concentric tube assembly with the cantilever being movable to extend into said furnace tube with said inner tube registering with and against said oven opening, said concentric inner and outer tubes defining therebetween a path for channeling gas exiting from the opposite end of the inner tube.

* * * * *